United States Patent
Morgan et al.

(10) Patent No.: US 9,464,782 B2
(45) Date of Patent: Oct. 11, 2016

(54) LIGHT PANEL, OPTICAL ASSEMBLY WITH IMPROVED INTERFACE AND LIGHT PANEL WITH IMPROVED MANUFACTURING TOLERANCES

(71) Applicant: Morgan Solar Inc., Toronto (CA)

(72) Inventors: John Paul Morgan, Toronto (CA); Stefan Myrskog, Maple (CA); Brett Barnes, Toronto (CA); Michael Sinclair, Toronto (CA); Nigel Morris, Toronto (CA)

(73) Assignee: Morgan Solar Inc., Toronto (CA)

( * ) Notice: Subject to any disclaimer, the term of this patent is extended or adjusted under 35 U.S.C. 154(b) by 218 days.

(21) Appl. No.: 14/196,291

(22) Filed: Mar. 4, 2014

(65) Prior Publication Data
US 2015/0083899 A1   Mar. 26, 2015

Related U.S. Application Data

(60) Provisional application No. 61/798,205, filed on Mar. 15, 2013.

(51) Int. Cl.
*F21V 7/04*    (2006.01)
*H01L 31/052*  (2014.01)
(Continued)

(52) U.S. Cl.
CPC ............... *F21V 7/04* (2013.01); *B32B 37/12* (2013.01); *F21V 7/00* (2013.01); *F21V 13/04* (2013.01);
(Continued)

(58) Field of Classification Search
CPC ............ F21V 7/04; F21V 7/00; F21V 13/04; F21V 17/02; F21V 29/004; B32B 37/12; G01J 1/0414; G01J 1/42

USPC .......................................................... 250/216
See application file for complete search history.

(56) References Cited

U.S. PATENT DOCUMENTS

| 4,045,245 A | 8/1977 | Coleman et al. |
| 4,148,299 A | 4/1979 | Sherman, Jr. |

(Continued)

FOREIGN PATENT DOCUMENTS

| CN | 202134560 | 2/2012 |
| EP | 1715260 B1 | 10/2006 |

(Continued)

OTHER PUBLICATIONS

Written Opinion mailed on Jun. 18, 2014 in corresponding PCT Application No. PCT/CA2014/000167.

(Continued)

*Primary Examiner* — Seung C Sohn
(74) *Attorney, Agent, or Firm* — Bereskin & Parr LLP/S.E.N.C.R.L.,s.r.l.

(57) ABSTRACT

Light panels, and methods of providing the light panels, are described. The described light panels are substantially transparent and can operate as an illumination device or as a solar panel. An example light panel includes a first optic layer for transmitting light; a second optic layer with a reflective surface configured for one of directing light from the first optic layer and directing light to the first optic layer; and a receiving assembly disposed between the first optic layer and the second optic layer. The receiving assembly includes a first receiving layer adjacent to the first optic layer; a second receiving layer adjacent to the second optic layer and separated from the first receiving layer; and a light device coupled to the first receiving layer. The light device can be configured to receive light from the reflective surface or to provide light to the reflective surface.

36 Claims, 13 Drawing Sheets

(51) Int. Cl.

| | | |
|---|---|---|
| H01L 31/042 | (2014.01) | |
| F21V 13/04 | (2006.01) | |
| F21V 8/00 | (2006.01) | |
| H01L 31/054 | (2014.01) | |
| B32B 37/12 | (2006.01) | |
| F21V 7/00 | (2006.01) | |
| F21V 17/02 | (2006.01) | |
| F21V 29/00 | (2015.01) | |
| G01J 1/04 | (2006.01) | |
| G01J 1/42 | (2006.01) | |
| H01L 31/02 | (2006.01) | |
| H01L 31/048 | (2014.01) | |
| H01L 31/05 | (2014.01) | |
| H01L 31/0687 | (2012.01) | |
| H02S 40/22 | (2014.01) | |

(52) U.S. Cl.
CPC .............. *F21V 17/02* (2013.01); *F21V 29/004* (2013.01); *G01J 1/0414* (2013.01); *G01J 1/42* (2013.01); *G02B 6/0001* (2013.01); *H01L 31/02013* (2013.01); *H01L 31/048* (2013.01); *H01L 31/052* (2013.01); *H01L 31/0508* (2013.01); *H01L 31/0525* (2013.01); *H01L 31/0543* (2014.12); *H01L 31/0547* (2014.12); *H01L 31/0687* (2013.01); *H02S 40/00* (2013.01); *H02S 40/22* (2014.12); *Y02E 10/52* (2013.01); *Y02E 10/544* (2013.01); *Y02P 70/521* (2015.11); *Y10T 29/49826* (2015.01)

(56) References Cited

U.S. PATENT DOCUMENTS

| | | | |
|---|---|---|---|
| 4,337,758 A | | 7/1982 | Meinel et al. |
| 4,877,460 A | | 10/1989 | Flodl |
| 4,962,450 A | | 10/1990 | Reshetin |
| 4,975,814 A | | 12/1990 | Schairer |
| 5,197,792 A | | 3/1993 | Jiao et al. |
| 5,528,057 A | * | 6/1996 | Yanagase ............... H01L 33/405 257/96 |
| 5,791,757 A | | 8/1998 | O'Neil et al. |
| 5,897,184 A | | 4/1999 | Eichenlaub et al. |
| 5,914,760 A | | 6/1999 | Daiku |
| 6,097,549 A | | 8/2000 | Jenkins et al. |
| 6,307,145 B1 | | 10/2001 | Kataoka et al. |
| 6,578,989 B2 | | 6/2003 | Osumi et al. |
| 6,811,277 B2 | | 11/2004 | Amano |
| 6,951,415 B2 | | 10/2005 | Amano et al. |
| 6,987,613 B2 | * | 1/2006 | Pocius ..................... G02B 5/32 257/98 |
| 7,021,805 B2 | | 4/2006 | Amano et al. |
| 7,072,096 B2 | | 7/2006 | Holman et al. |
| 7,083,313 B2 | | 8/2006 | Smith |
| 7,152,985 B2 | | 12/2006 | Benitez et al. |
| 7,160,010 B1 | | 1/2007 | Chinniah et al. |
| 7,290,906 B2 | | 11/2007 | Suzuki et al. |
| 7,316,496 B2 | | 1/2008 | Wu et al. |
| 7,391,939 B1 | | 6/2008 | Williams |
| 7,431,481 B2 | | 10/2008 | Stefanov |
| 7,467,879 B2 | | 12/2008 | Herloski et al. |
| 7,626,761 B2 | | 12/2009 | Haga et al. |
| 7,664,350 B2 | | 2/2010 | Ghosh et al. |
| 7,672,549 B2 | | 3/2010 | Ghosh et al. |
| 7,697,219 B2 | | 4/2010 | DiDomenico |
| 7,740,392 B2 | | 6/2010 | Itoh et al. |
| 7,794,100 B2 | | 9/2010 | Ito |
| 7,855,335 B2 | | 12/2010 | Maeda |
| 7,873,257 B2 | | 1/2011 | Morgan |
| 7,925,129 B2 | | 4/2011 | Ghosh et al. |
| 8,030,569 B2 | | 10/2011 | Nakata |
| 8,067,688 B2 | | 11/2011 | Gronet |
| 8,279,164 B2 | | 10/2012 | Daiku |
| 8,412,010 B2 | | 4/2013 | Ghosh et al. |
| 8,586,860 B2 | | 11/2013 | Nakata |
| 8,609,455 B2 | | 12/2013 | Krasnov et al. |
| 8,885,995 B2 | | 11/2014 | Morgan |
| 2002/0024808 A1 | | 2/2002 | Suehiro et al. |
| 2007/0181901 A1 | | 8/2007 | Loh |
| 2007/0189017 A1 | | 8/2007 | Hofmann |
| 2007/0236927 A1 | | 10/2007 | Liu |
| 2007/0256724 A1 | | 11/2007 | Fork et al. |
| 2007/0256725 A1 | | 11/2007 | Fork et al. |
| 2007/0256726 A1 | | 11/2007 | Fork et al. |
| 2007/0279910 A1 | | 12/2007 | Lin |
| 2008/0087321 A1 | | 4/2008 | Schwartzman |
| 2008/0316761 A1 | | 12/2008 | Minano et al. |
| 2009/0071467 A1 | | 3/2009 | Benitez |
| 2009/0165842 A1 | | 7/2009 | McDonald |
| 2009/0188546 A1 | | 7/2009 | McGlynn et al. |
| 2009/0213607 A1 | | 8/2009 | Tatsukawa |
| 2009/0256999 A1 | | 10/2009 | Ogasawara et al. |
| 2009/0277498 A1 | | 11/2009 | Angel |
| 2010/0012169 A1 | | 1/2010 | Jensen et al. |
| 2010/0024868 A1 | | 2/2010 | Baruchi et al. |
| 2010/0043864 A1 | | 2/2010 | Young et al. |
| 2010/0051102 A1 | | 3/2010 | Lin |
| 2010/0059108 A1 | | 3/2010 | McDonald et al. |
| 2010/0116319 A1 | | 5/2010 | Martinez Anton et al. |
| 2010/0116336 A1 | | 5/2010 | Martinez Anton et al. |
| 2010/0165495 A1 | | 7/2010 | Murtha |
| 2010/0186798 A1 | | 7/2010 | Tormen et al. |
| 2010/0224232 A1 | | 9/2010 | Cummings et al. |
| 2011/0011449 A1 | | 1/2011 | Morgan et al. |
| 2011/0044000 A1 | | 2/2011 | Minano et al. |
| 2011/0096426 A1 | | 4/2011 | Ghosh et al. |
| 2011/0120539 A1 | | 5/2011 | Miñano et al. |
| 2011/0132426 A1 | | 6/2011 | Kang et al. |
| 2011/0132432 A1 | | 6/2011 | Schultz et al. |
| 2011/0155210 A1 | | 6/2011 | Kim et al. |
| 2011/0155221 A1 | | 6/2011 | Yu et al. |
| 2011/0214738 A1 | | 9/2011 | Halahmi et al. |
| 2011/0292655 A1 | | 12/2011 | Ing et al. |
| 2012/0055552 A1 | | 3/2012 | Morgan et al. |
| 2012/0099325 A1 | | 4/2012 | Ghosh et al. |
| 2012/0112557 A1 | | 5/2012 | Sager |
| 2012/0145221 A1 | | 6/2012 | Ozaki et al. |
| 2012/0152331 A1 | | 6/2012 | Luo |
| 2012/0160300 A1 | | 6/2012 | Munro |
| 2012/0167949 A1 | | 7/2012 | Dentinger et al. |
| 2012/0247537 A1 | | 10/2012 | Mei |
| 2012/0255594 A1 | | 10/2012 | Bishnoi et al. |
| 2012/0287671 A1 | | 11/2012 | Parker et al. |
| 2012/0298181 A1 | | 11/2012 | Cashion et al. |
| 2012/0298182 A1 | | 11/2012 | Hwang |
| 2012/0312356 A1 | | 12/2012 | Mizuo et al. |
| 2012/0318319 A1 | | 12/2012 | Pinarbasi et al. |
| 2013/0104984 A1 | | 5/2013 | Myrskog |
| 2013/0118559 A1 | | 5/2013 | Castillo et al. |
| 2013/0233384 A1 | | 9/2013 | Morgan et al. |
| 2013/0247960 A1 | | 9/2013 | Morgan |
| 2013/0249293 A1 | | 9/2013 | Yang et al. |
| 2013/0276866 A1 | | 10/2013 | Maeda |
| 2013/0284237 A1 | | 10/2013 | Lin et al. |
| 2013/0298901 A1 | | 11/2013 | Ruiz et al. |

FOREIGN PATENT DOCUMENTS

| | | |
|---|---|---|
| EP | 1895228 B1 | 5/2009 |
| EP | 2061092 A1 | 5/2009 |
| EP | 2105682 A2 | 9/2009 |
| EP | 2492966 B1 | 9/2014 |
| JP | 02-277033 | 11/1990 |
| JP | 03-253833 | 11/1991 |
| JP | 06-160638 | 6/1994 |
| JP | 10-012024 | 1/1998 |
| JP | 11-271749 | 10/1999 |
| JP | 2006-114239 | 4/2006 |
| JP | 2006-318807 | 11/2006 |
| JP | 2007-033803 | 2/2007 |
| JP | 2010-101912 | 5/2010 |
| JP | 2013-080832 | 5/2013 |
| WO | 2009/002281 A2 | 12/2008 |

(56) References Cited

FOREIGN PATENT DOCUMENTS

| WO | 2010033632 A2 | 3/2010 |
|---|---|---|
| WO | 2010033859 A2 | 3/2010 |
| WO | 2011011885 A1 | 2/2011 |
| WO | 2011022631 A2 | 2/2011 |
| WO | 2010124028 A2 | 10/2011 |
| WO | 2011120148 A1 | 10/2011 |
| WO | 2012014088 A2 | 2/2012 |
| WO | 2012085461 A1 | 6/2012 |
| WO | 2013010313 A1 | 1/2013 |
| WO | 2014005102 A1 | 1/2014 |

OTHER PUBLICATIONS

International Preliminary Report on Patentability issued on Sep. 15, 2015 in corresponding PCT Application No. PCT/CA2014/000167.
International Search Report, International Patent Application No. PCT/CA2014/000167, dated Jun. 18, 2014.
U.S. Appl. No. 61/274,735.
Blair L. Unger, Dimpled Planar Lightguide Solar Concentrators, Edmund A. Hajim School of Engineering and Applied Science, University of Rochester, 2010, pp. 1-137, Rochester, New York.
Jason H. Karp, et al. Planar micro-optic solar concentration using multiple imaging lenses into a common slab waveguide, Jacobs School of Engineering, University of California San Diego, Aug. 4, 2009.
Justin M. Hallas, et al., Lateral translation micro-tracking of planar micro-optic solar concentrator, Proceedings of SPIE, vol. 7769, The International Society for Optics and Photonics, 2010, pp. 1-7, Bellingham, Washington.
M. Victoria, et al., Optical Characterization of FluidReflex Concentrator, Instituto de Energia Solar, Universida Politecnica, Apr. 9, 2010, Madrid, Spain.
Marc Steiner, et al., Increasing the Energy Yield of CPV Modules through Optimized Solar Cell Interconnection, AIP Conference Proceedings, vol. 1407, American Institute of Physics, 2011, pp. 404-408.
Roland Winston et al., Planar concentrators near the étendue limit, Optics Letters, vol. 30, No. 19, Optical Society of America, Oct. 1, 2005, pp. 2617-2619, Washington, D.C.
Roland Winston, Thermodynamically Efficient Nonimaging Optics, Dan David Symposium, Sep. 26, 2008, University of California, Merced, California.
Solar Centre, printed Feb. 13, 2013, "Concentrated Photovoltaics, Solfocus", www.dkasolarcentre.com.au/go/technologies/concentrated-photovoltaics-solfocus.
Yuya Sakurada, et al., Simulation of Temperature Characteristics of InGaP/InGaAs/Ge Triple-Junction Solar Cell under Concentrated Light, Japanese Journal of Applied Physics, vol. 50, The Japan Society of Applied Physics, Apr. 20, 2011, pp. 1-4, Tokyo, Japan.

* cited by examiner

LIGHT PANEL, OPTICAL ASSEMBLY WITH IMPROVED INTERFACE AND LIGHT PANEL WITH IMPROVED MANUFACTURING TOLERANCES

CROSS-REFERENCE TO RELATED APPLICATIONS

This application claims the benefit of U.S. Provisional Patent Application No. 61/798,205, filed Mar. 15, 2013.

FIELD

The described embodiments relate to light panels and in particular, light panels that are substantially transparent. The light panel may be used as a solar collector or as an illumination device.

BACKGROUND

Solar power systems include optical components that operate to concentrate solar energy onto photovoltaic cells. The photovoltaic cells collect the solar energy and convert the solar energy into electric current.

Existing solar power systems can be expensive and limited in structure. Certain solar power systems may protect the optical components by enclosing the optical components with aluminum frames, which can be expensive. Some other solar power systems may use glass to protect the optical components but the physical configuration of glass is generally limited since glass cannot be easily molded into different shapes.

The structure of existing solar power systems can also restrict the assembly process. Solar power systems generally include an array of optical components and each optical component corresponds to at least one photovoltaic cell. The distance between each photovoltaic cell within the array of photovoltaic cells and the distance between each optical component within the array of optical components are generally predefined so that variations at assembly are not possible. As a result, any shrinkage of an optical component or error in positioning of a photovoltaic cell can lead to misalignment between most, if not all, of the optical components and the respective photovoltaic cells.

Solar power systems that are more cost-effective and simpler to manufacture are needed. These solar power systems should also be versatile in design so that they can also be adapted as illumination devices.

SUMMARY

Various embodiments described herein generally relate to a light panel comprising:
  a first optic layer for transmitting light;
  a second optic layer having a reflective surface configured for one of directing light from the first optic layer and directing light to the first optic layer; and
  a receiving assembly disposed between the first optic layer and the second optic layer, the receiving assembly having:
    a first receiving layer adjacent to the first optic layer;
    a second receiving layer adjacent to the second optic layer and separated from the first receiving layer; and
    a light device coupled to the first receiving layer, the light device being operable to receive light from the reflective surface via the second receiving layer when the reflective surface is configured to direct light from the first optic layer; and the light device being operable to provide light to the reflective surface via the second receiving layer when the reflective surface is configured to direct light to the first optic layer;
  wherein each of the first optic layer, the second optic layer and the receiving assembly is substantially transparent.

In accordance with various embodiments described herein, there is provided a light panel array comprising a series of at least two light panels described herein, In accordance with various embodiments described herein, there is provided a method for providing a light panel by an assembler. The method involves:
  providing a receiving assembly, the receiving assembly having:
    a first receiving layer;
    a second receiving layer separated from the first receiving layer; and
    a light device coupled to the first receiving layer;
  scanning, with an optical module, the receiving assembly to determine a position of the light device;
  placing a first optic layer adjacent to the first receiving layer based on the position of the light device; and
  placing a second optic layer adjacent to the second receiving layer based on the placement of the first optic layer;
  wherein each of the first optic layer, the second optic layer and the receiving assembly is substantially transparent.

DETAILED DESCRIPTION OF DRAWINGS

Several embodiments of the present invention will now be described in detail with reference to the drawings, in which.

Figure 1B:
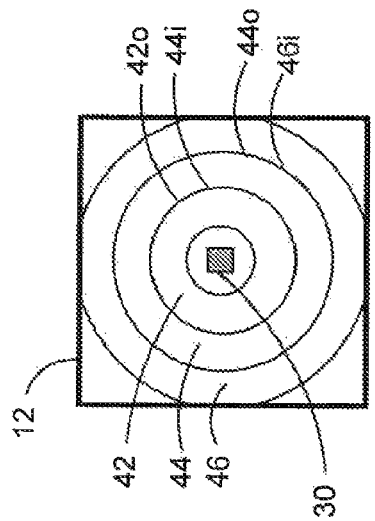
FIG. 1B is a top view of the light panel of FIG. 1.

The drawings, described below, are provided for purposes of illustration, and not of limitation, of the aspects and features of various examples of embodiments described herein. For simplicity and clarity of illustration, elements shown in the drawings have not necessarily been drawn to scale. The dimensions of some of the elements may be exaggerated relative to other elements for clarity. It will be

DESCRIPTION OF EXAMPLE EMBODIMENTS

It will be appreciated that numerous specific details are set forth in order to provide a thorough understanding of the example embodiments described herein. However, it will be understood by those of ordinary skill in the art that the embodiments described herein may be practiced without these specific details. In other instances, well-known methods, procedures and components have not been described in detail so as not to obscure the embodiments described herein. Furthermore, this description and the drawings are not to be considered as limiting the scope of the embodiments described herein in any way, but rather as merely describing the implementation of the various embodiments described herein.

The various embodiments described herein generally relate to light panels that are substantially transparent. The transparency of the light panel can, at least, simplify the assembly process and improve a tolerance of the light panel.

For example, substantially transparent light panels can be formed using a plastic material. When compared with other materials, such as metal for instance, plastic materials are easier to shape into different configurations. Plastic materials are also typically less expensive than metal materials.

Also, since the light panels described herein are substantially transparent, the light panels can be used as windows (e.g., skylights) of buildings and therefore, serve multiple purposes. For example, when the light panels operating as illumination devices are used as windows, the light panels allow passage of light into an interior of the building while also capturing light for later or further illumination of the interior.

Figure 1C:
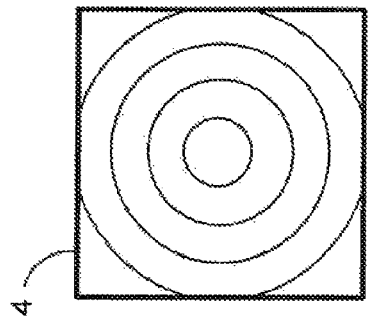
FIG. 1C is a bottom view of the light panel of FIG. 1.
Figure 1A:
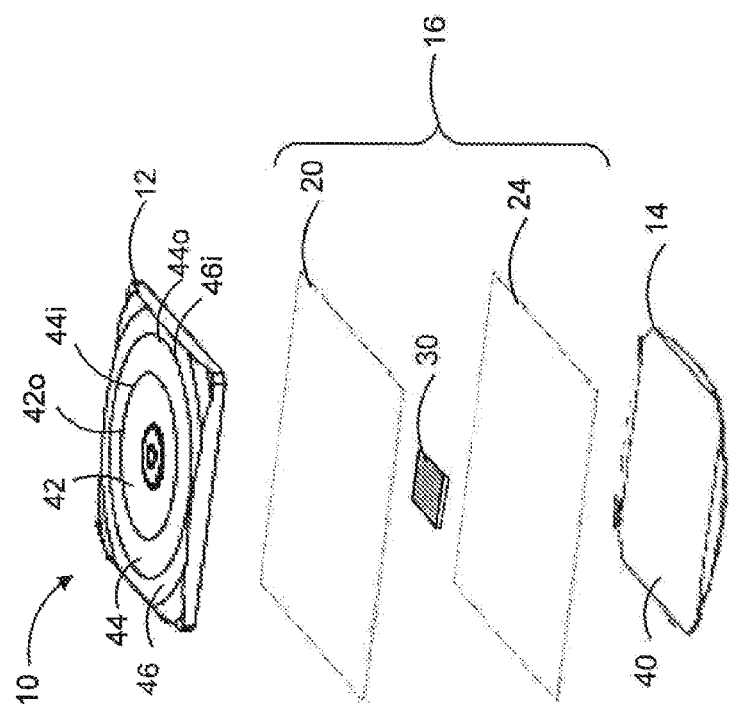
FIG. 1A is an exploded perspective view of a light panel in accordance with an example embodiment.

Reference is first made to FIG. 1A, which illustrates an exploded perspective view of an example light panel 10, FIG. 1B is a top view of the light panel 10 and FIG. 1C is a bottom view of the light panel 10.

Figure 2:
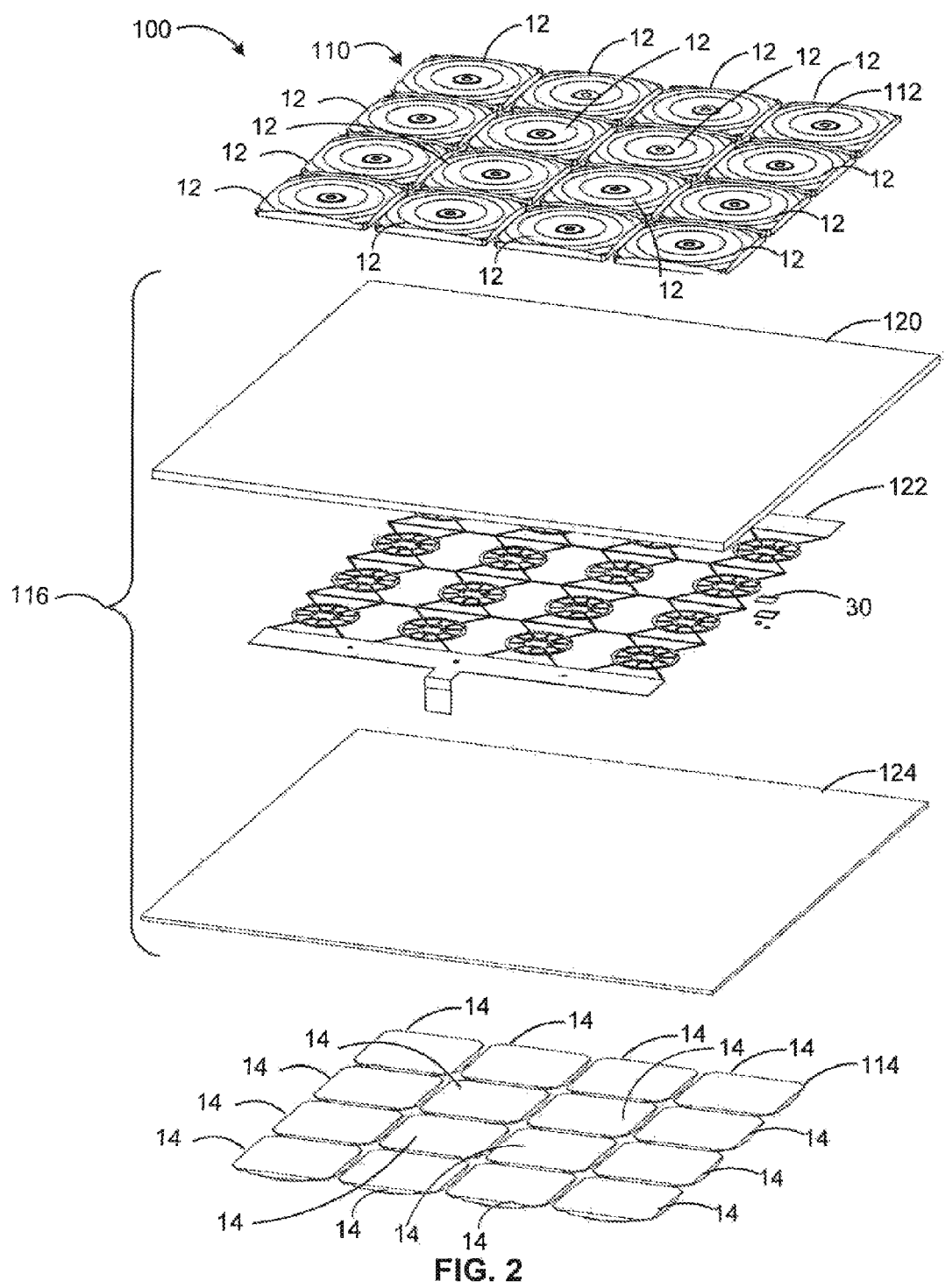
FIG. 2 is an exploded perspective view of a light panel array in accordance with an example embodiment.

The light panel 10, or a variation of the light panel, may also be provided in a light panel array. For example, as shown in FIG. 2, an arrangement of two or more light panels 110 can be provided in a light panel array 100. The light panel array 100 includes sixteen light panels 110 arranged in a four by four configuration. The light panels 110 in the example of FIG. 2 are similar to the light panel 10 shown in FIG. 1A except the light panel 110 includes a heat spreader 122. It will be understood that various other array configurations can similarly be used.

Referring again to FIG. 1A, the light panel 10 includes a first optic layer 12 for transmitting light and a second optic layer 14 having a reflective surface 40 for directing light. Depending on the application of the light panel 10, as will be described, the reflective surface 40 can direct light to the first optic layer 12 or direct light received from the first optic layer 12. Further, the reflective surface 40 may reflect light by total internal reflection (TIR) or may include a mirror coating (not shown) for reflecting light. The light panel 10 also includes a receiving assembly 16 disposed between the first optic layer 12 and the second optic layer 14.

The first optic layer 12 acts to transmit light and includes one or more lenses. The lenses may be annular in shape in some embodiments. For example, as shown in FIGS. 1A and 1B, the first optic layer 12 of the light panel 10 can include three annular and concentric lenses 42, 44 and 46 each with a different radius. The annular lenses 42, 44 and 46 can be provided in a series. That is, an annular lens, such as annular lens 42, can be provided to fit within an inner circle of another annular lens, such as annular lens 44. In this way, an outer edge 42o of the annular lens 42 can be coupled to an inner edge 44i of the annular lens 44. Similarly, the annular lens 44 can be provided to fit within an inner circle of yet another outer annular lens, such as annular lens 46 (i.e., an outer edge 44o of the annular lens 44 can be coupled to an inner edge 46i of the annular lens 46), and so on. It will be understood that a fewer or greater number of annular lenses may be used in the first optic layer 12.

As shown in FIG. 1A, the receiving assembly 16 includes a first receiving layer 20 that is adjacent to the first optic layer 12 and a second receiving layer 24 that is adjacent to the second optic layer 14. The second receiving layer 24 is separate from the first receiving layer 20.

In some embodiments, at least a portion of the separation between the first receiving layer 20 and the second receiving layer 24 can be filled with an encapsulant. The encapsulant can help distribute heat at the receiving assembly 16 and can also facilitate the separation between the first receiving layer 20 and the second receiving layer 24. The encapsulant may include silicone, for example.

As shown in FIG. 2, a heat spreader 122 may be disposed between the first receiving layer 120 and the second receiving layer 124. The heat spreader 122 may generally include a heat-conducting arrangement that helps to radiate or dissipate heat across a surface of the receiving assembly 116. The heat spreader 122 may also facilitate electrical conductivity. For example, the heat spreader can act as an electrical interconnection between the light devices 30. Since the heat spreader 122 is typically not formed of a transparent material, the heat spreader 122 is usually provided in a configuration that would minimally interfere with the light path between the first optic layer 112 and the second optic layer 114. For instance, the heat spreader 122 in FIG. 2 is provided in a hub and spoke configuration so that more spacing is available to allow passage of light between the first optic layer 112 and the second optic layer 114. The heat spreader 122 may similarly be provided in other suitable configurations, such as a planar configuration.

Referring again to FIG. 1A, as shown, a light device 30 can be mounted within the receiving assembly 16 so as to be in optical communication with the reflective surface 40 of the second optic layer 14. That is, an opening of the light device 30 faces the reflective surface 40 but faces away from the first optic layer 12.

The light device 30 may be coupled, directly or indirectly, to the first receiving layer 20. For example, when the heat spreader 122 is included in the light panel 110 of FIG. 2, the light device 30 may be mounted to the heat spreader 122. As will be described, the light device 30 can operate to provide light to the second optic layer 14 via the second receiving layer 24 or to receive light from the second optic layer 14 via the second receiving layer 24.

As is generally understood, a size of the light device 30 can affect its operation. That is, a light device 30 with a smaller surface area is typically less sensitive than a light device 30 with a larger surface area. A light device 30 with the smaller surface area requires more precise alignment with the first optic layer 12 than a light device 30 with the larger surface area. To maximize the transparency of the light device 30, in some embodiments, a size of the light device 30 may be provided approximately based on a size of a lens at the first optic layer 12 or a surface area of the first optic layer 12 as a whole. For example, a surface area of the light device 30 may be approximately 1000 to 2000 times smaller than the surface area of the first optic layer 12.

In embodiments in which the first optic layer 12 includes more than one lens, the size of the light device 30 may be determined based on a surface area of one or more of the lenses at the first optic layer 12 or with respect to the surface area of the first optic layer 12 as a whole.

The second optic layer 14 can be provided substantially parallel to the first optic layer 12. As noted, the first optic layer 12 and the second optic layer 14, together, cooperate to provide a light path between the lens 42, 44, or 46 and the light device 30. The position of the light device 30 relative to the optical components at the first optic layer 12 (such as the lens) and the second optic layer 14 can be critical to the efficiency of the light panel 10. To facilitate the light path between the first optic layer 12 and the light device 30, the light device 30 can be coupled to the first receiving layer 20 relative to the one or more lens at the first optic layer 12.

Depending on the application of the light panel 10, the first optic layer 12 may transmit light received from an external source (e.g., the sun) to the reflective surface 40 or transmit light provided by the light source 30, via the reflective surface 40, externally away from the light panel. The reflective surface 40 can direct the light within one or more reflections.

Figure 3A:
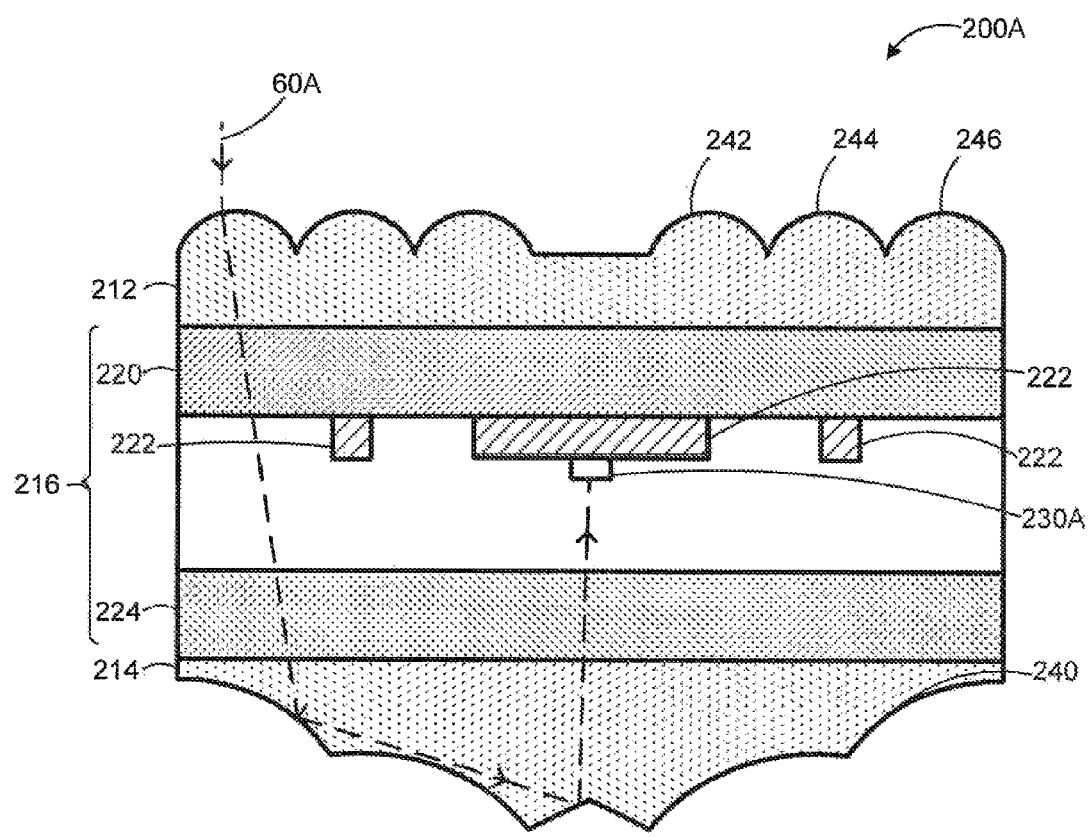
FIG. 3A is a cross-sectional view of a light panel operating as a solar panel in accordance with an example embodiment.
Figure 3B:
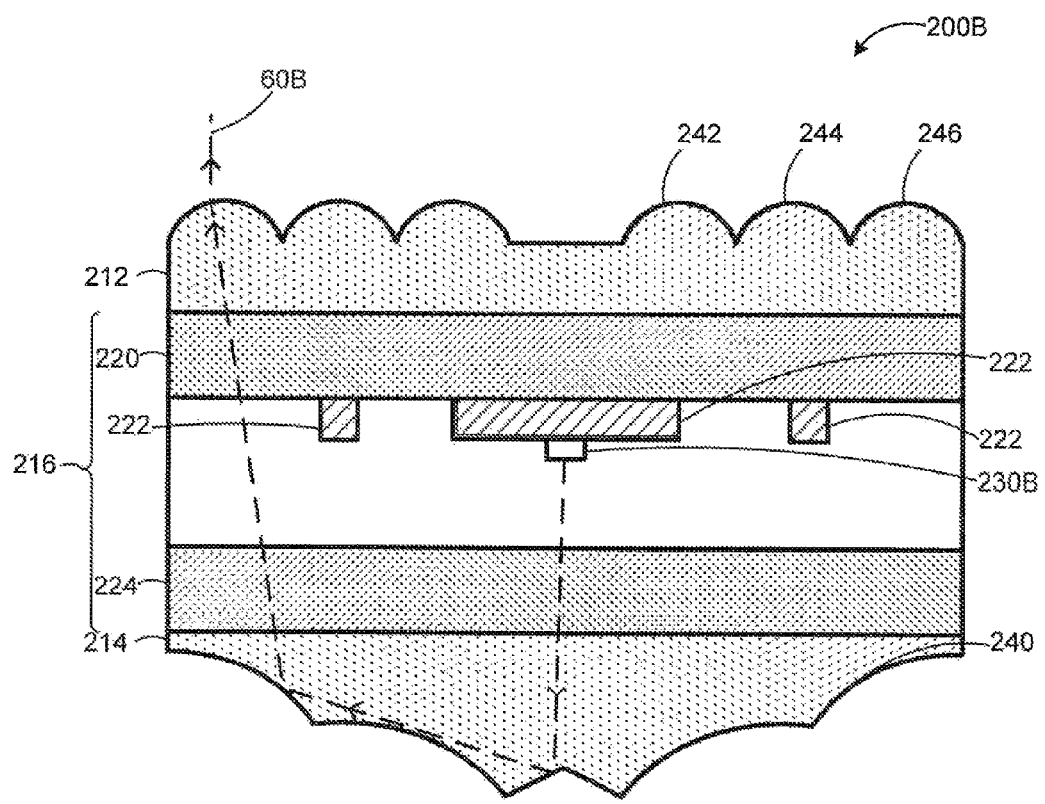
FIG. 3B is a cross-sectional view of a light panel operating as an illumination device in accordance with an example embodiment.

Reference will now be made to FIGS. 3A and 3B, which are cross-sectional views of the light panel 10 which illustrate the light panel 10 operating in two different application modes.

Depending on the type of light device 30 used, the light panel 10 can be adapted to operate either as a solar panel or as an illumination device. When the light device 30 includes a photovoltaic (PV) cell, for instance, the light panel 10 can operate as a solar panel by receiving light via the first optic layer 12 and directing, by the second optic layer 14, the received light to the PV cell for collection. If the light device 30 includes a light source, the light panel 10 can operate as an illumination device by providing light to the second optic layer 14, which then directs the light to the first optic layer 12 to be transmitted externally.

FIG. 3A is a cross-sectional view of a light panel 200A operating as a solar panel in accordance with an example embodiment. The light panel 200A, similar to the light panel 10 of FIGS. 1A to 1C, includes the first optic layer 212 and the second optic layer 214. Similar to the receiving assembly 116 of FIG. 2, the receiving assembly 216 includes a heat spreader 222 between the first receiving layer 220 and the second receiving layer 224.

In the embodiment of FIG. 3A, the light device 230A includes a PV cell for collecting light received via the first optic layer 212. An example light path 60A is shown. The light panel 200A operates based on light provided by an external source, such as the sun. The light path 60A, therefore, begins from outside the light panel 200A. On contact with the first optic layer 212, the light path 60A can be refracted as it passes through the first optic layer 212 and across the receiving assembly 216. The lenses 242, 244, and 246 can focus light received, such as light received along the light path 60A, through openings in the heat spreader 222. The openings in the heat spreader 222 are regions within the heat spreader 222 that do not cover the second receiving layer 224. When the light path 60A arrives at the second optic layer 214, the light path 60A is directed by the reflective surface 240 to the light device 230A. The reflective surface 240 in this example is provided so that it can direct the light to the light device 230A within two reflections. It will be understood that a fewer or greater number of reflections may similarly be used.

It should also be understood that only one light path 60A is shown in FIG. 3A for ease of exposition. Multiple light paths 60A can occur at any one time during operation of the light panels 10, 110, and 200A described herein.

Referring now to FIG. 3B, which is a cross-sectional view of a light panel 200B operating as an illumination device in accordance with an example embodiment. The arrangement of the light panel 200B is generally analogous to the arrangement of the light panel 200A except that the light device 230B includes a light source instead of a PV cell.

The light device 230B in the light panel 200B provides light that is eventually transmitted by the first optic layer 212 externally away from the light panel 200B. An example light path 60B is shown. The light path 60B begins at the light device 230B. When the light path 60B arrives at the second optic layer 214, the light path 60B is directed by the reflective surface 240 towards the first optic layer 212 via the receiving assembly 216. As described, the reflective surface 240 is provided so that it can direct the light towards the first optic layer 212 within two reflections. On contact with the first optic layer 212, the light path 60B may be refracted as it is transmitted externally away from the light panel 200B. The lenses 242, 244, and 246 may receive light that has been reflected by the reflective surface 240, such as along the light path 60B. The lenses 242, 244 and 246 may then collimate the light received from the reflective surface 240 so that the light panel 200B can provide a collimated beam via the first optic layer 212.

As noted, the light panels 10, 110, 200A and 200B described herein are substantially transparent. Referring to FIG. 1A, each of the first optic layer 12, the second optic layer 14, the first receiving layer 20 and the second receiving layer 24 can be composed of a substantially transparent material. Since the first and second optic layers 12 and 14 and the first and second receiving layers 20 and 24 generally provide different functions, different materials may be appropriate for the first and second optic layers 12 and 14 and the first and second receiving layers 20 and 24.

For example, the material used for the first and second optic layers 12 and 14 should be capable of being molded into different optical components to facilitate the transmission, refraction and reflection of light (e.g., by total internal reflection), whereas the material used for the first and second receiving layers 20 and 24 can be more rigid in order to better protect the light device 30 and to provide structural support to the light panel 10.

Also, the material used for the first optic layer 12 and the second optic layer 14 can have a different coefficient of thermal expansion than the material used for the first and second receiving layers 20 and 24.

The material used for the first optic layer 12 and the second optic layer 14 may be a polymer-based material, such as poly(methyl methacrylate) (PMMA). Polymer-based materials tend to be more malleable and can, therefore, enable molding into optical components of different shapes. Components formed from polymer-based materials, compared to glass for example, are also easier and less expensive to fabricate since more conventional fabrication techniques, such as injection molding, are available.

The material used for the first receiving layer 20 and the second receiving layer 24 may be glass. Glass, compared to polymer-based materials, is more rigid and stable. As is known, an elastic modulus for glass in terms of Young's modulus is approximately between 70 to 300 GPa whereas the elastic modulus for polymer-based materials such as PMMA is approximately between 1.8 to 3.1 GPa. The rigidity of glass can protect the receiving assembly 16. Glass can also be constructed to cover larger surface areas. Glass can also provide electrical insulation.

For example, since the receiving assembly 16 is disposed between the first optic layer 12 and the second optic layer 14, the polymer-based first optic layer 12 and the second optic layer 14 can act as a protective layer for the first receiving layer 20 and the second receiving layer 24. Also, the use of glass at the first optic layer 12 and the second optic layer 14 facilitates positioning of the receiving assembly 16. As described herein, the position of the receiving assembly 16 substantially affects the effectiveness of the light panel 10. The rigidity of the glass can minimize unwanted movement of the receiving assembly 16.

The use of materials with different coefficients of thermal expansion may cause problems at the interface between these materials. Since the material at the first and second optic layers 12 and 14 is generally associated with a higher coefficient of thermal expansion than the material at the first and second receiving layers 20 and 24, the first optic layer 12 and the first receiving layer 20 and the second optic layer 14 and the second receiving layer 24 may have different physical reactions to heat. Any adhesive or bond between the first optic layer 12 and the first receiving layer 20 may be broken or impaired as the first optic layer 12 is likely to expand sooner than the first receiving layer 20 in response to heat. The second optic layer 14 may operate similarly as the first optic layer 12. To accommodate the different coefficients of thermal expansion, an elastomeric interface may be provided between the first optic layer 12 and the first receiving layer 20, and also between the second optic layer 14 and the second receiving layer 24.

Figure 4A:
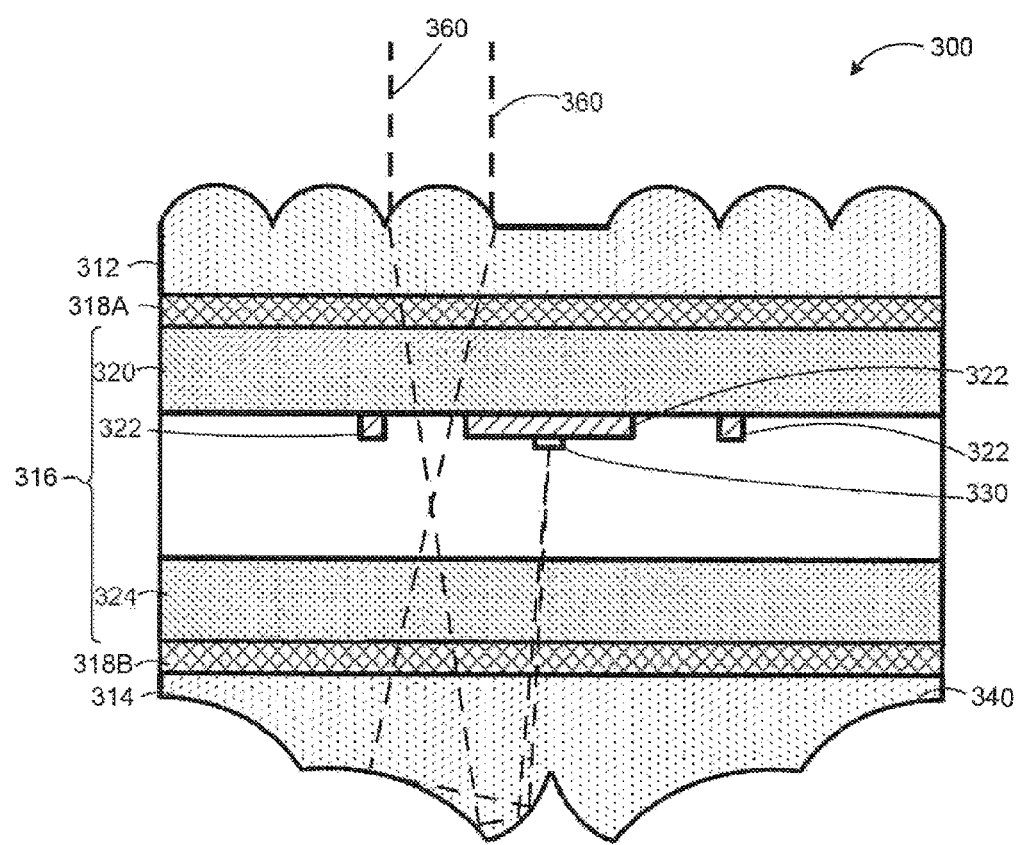
FIG. 4A is a cross-sectional view of a light panel in accordance with another example embodiment.
Figure 4B:
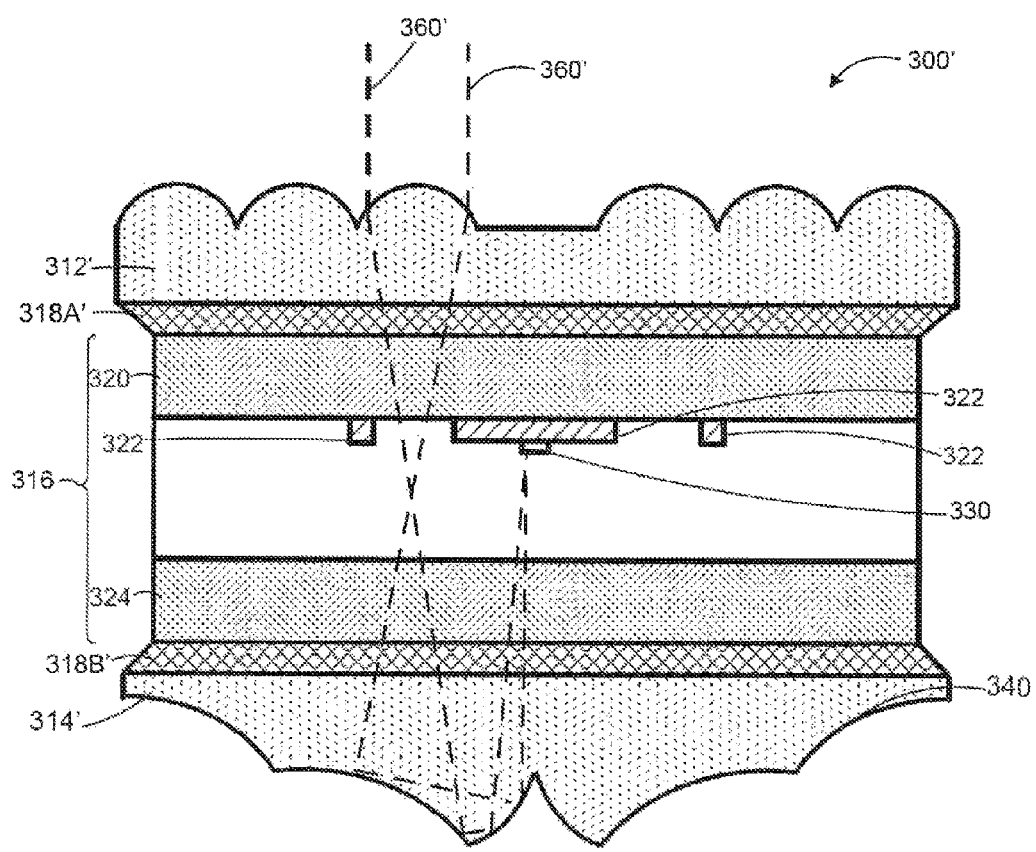
FIG. 4B illustrates the light panel of FIG. 4A after being exposed to a high temperature environment in accordance with an example embodiment.
Figure 4C:
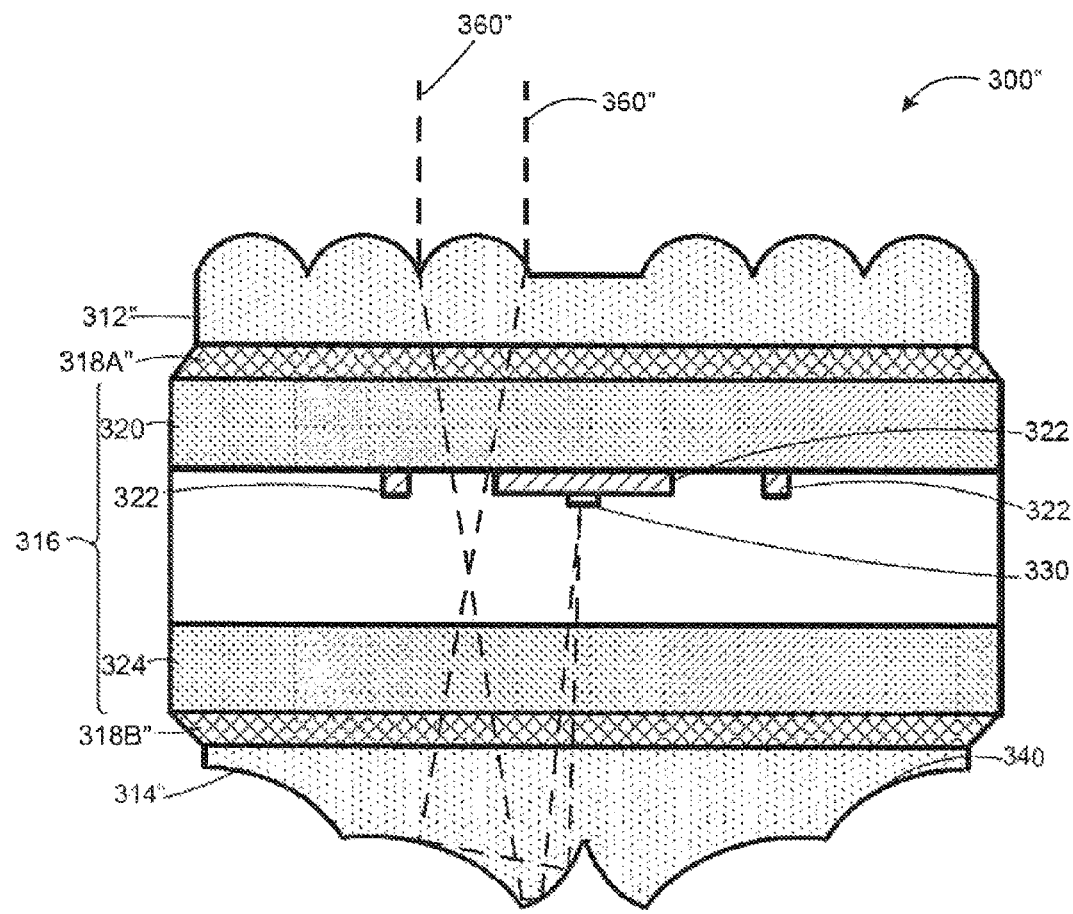
FIG. 4C illustrates the light panel of FIG. 4A after being exposed to a low temperature environment in accordance with an example embodiment.

FIGS. 4A, 4B and 4C are cross-sectional views of other example light panels in accordance with various embodiments, FIG. 4A is a cross-sectional view of the light panel 300. The arrangement of the light panel 300 is generally similar to the arrangement of the light panels 200A and 200B. The light panel 300 includes the first optic layer 312, the second optic layer 314 and the receiving assembly 316. Similar to the light panel 10 of FIG. 1A, a reflective surface 340 is provided at the second optic layer 314 for directing light. As described herein, depending on the application of the light panel 300, the reflective surface 340 can direct light to the first optic layer 312 or direct light received from the first optic layer 312.

The receiving assembly 316 includes the first receiving layer 320 and the second receiving layer 324. The heat spreader 322 is provided between the first receiving layer 320 and the second receiving layer 324. Example light paths 360 are shown in FIG. 4A. The light paths 360 are shown without any specific direction since the light paths 360, as described herein, will travel in different directions depending on the application of the light panel 300. For example, the light paths 360 will travel towards the light device 330 when the light panel 300 operates as a solar panel and the light paths 360 will travel away from the light device 330 when the light panel 300 operates as an illumination device. The light device 330 is also mounted to the heat spreader 322. Unlike the light panels 200A and 200B, however, the light panel 300 includes a first elastomeric interface 318A between the first optic layer 312 and the first receiving layer 320 and a second elastomeric interface 318B between the second optic layer 314 and the second receiving layer 324.

The first and second elastomeric interfaces 318A and 318B can physically adjust to physical changes that may occur at the other components, in particular at the first and second optic layers 312 and 314. As a result, the first elastomeric interface 318A, for example, can minimize any stress that may otherwise be present between the first optic layer 312 and the first receiving layer 320. The first elastomeric interface 318A may also act as an adhesive between the first optic layer 312 and the first receiving layer 320. The second elastomeric interface 318B operates in an analogous function as the first elastomeric interface 318A for the second optic layer 314 and the second receiving layer 324.

Generally, the elastomeric interfaces 318A and 318B can be formed from one or more materials associated with high elongation properties. Example materials may include silicone, ethylene-vinyl acetate and ionomer. Silicone, for example, can accommodate approximately 500% elongation (i.e., an elastomeric interface 318 formed with silicone can expand to approximately five times its original size without breaking).

FIG. 4B shows a light panel 300' after being exposed to a high temperature environment, such as from being exposed to solar energy for a certain period of time and/or from heat generated by the light device 330. As shown in FIG. 4B, the light panel 300' includes an expanded first optic layer 312' and a correspondingly expanded first elastomeric interface 318A' and an expanded second optic layer 314' and a correspondingly expanded second elastomeric interface 318B'. The expanded first optic layer 312' and the expanded second optic layer 314' result in response to the optic layers being exposed to heat. The first elastomeric interface 318A also expands with the first optic layer 312, resulting in the expanded first elastomeric interface 318A'. The second elastomeric interface 318B similarly expands with the second optic layer 314, resulting in the expanded second elastomeric interface 318B. In this way, the bond between the expanded first optic layer 312' and the first receiving layer 320 as well as the bond between the expanded second optic layer 314' and the second receiving layer 324 are maintained and the transmission of light within the light panel 300 is not impaired as illustrated by exemplary light paths 360'.

FIG. 4C shows a light panel 300" after being exposed to a low temperature environment. As shown in FIG. 4C, the light panel 300" includes a contracted first optic layer 312" and a correspondingly contracted first elastomeric interface 318A" and a contracted second optic layer 314" and a correspondingly contracted second elastomeric interface 318B". The contracted first optic layer 312" and the contracted second optic layer 314" result in response to being exposed to low temperatures. The first elastomeric interface 318A also contracts with the first optic layer 312, resulting in the contracted first elastomeric interface 318A". The second elastomeric interface 318B similarly contracts with the second optic layer 314, resulting in the contracted second elastomeric interface 318B". In this way, the bond between the contracted first optic layer 312" and the first receiving layer 320 as well as the bond between the contracted second optic layer 314" and the second receiving layer 324 are maintained and the transmission of light within the light panel 300 is not impaired, as illustrated by exemplary light paths 360".

Figure 4D:
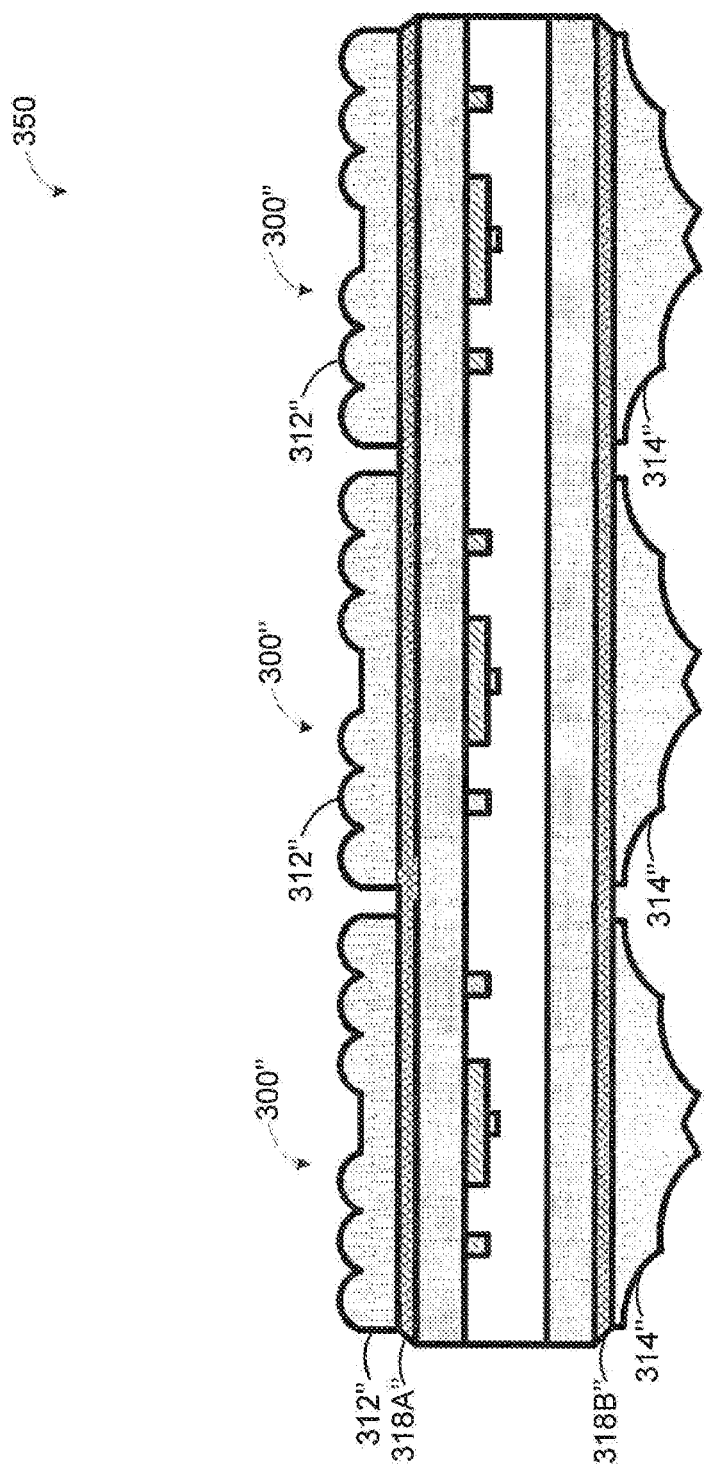
FIG. 4D is an array of the light panel of FIG. 4C in accordance with an example embodiment.

A light panel array 350 formed of three light panels 300" is shown in FIG. 4D. As shown in FIG. 4D, by providing the elastomeric interfaces 318A and 318B in the light panels 300", the optic layers 312 and 314 of the light panels 300" in the light panel array 350 can uniformly contract when exposed to a low temperature environment. When exposed to a high temperature environment, the optic layers 312 and 314 can similarly uniformly expand (not shown).

Reference will now be made to FIGS. 5A to 5D, which are cross-sectional views of light panels operating as solar panels in accordance with various different embodiments. The components of the light panels shown in FIGS. 5A to 50 are similar to the light panel 300 of FIG. 4A. Each of the light panels shown in FIGS. 5A to 5D includes a first optic layer 412, a first elastomeric layer 418A, a first receiving layer 420, a second receiving layer 424 and a second elastomeric layer 418B. A heat spreader 422 is also provided.

Figure 5A:
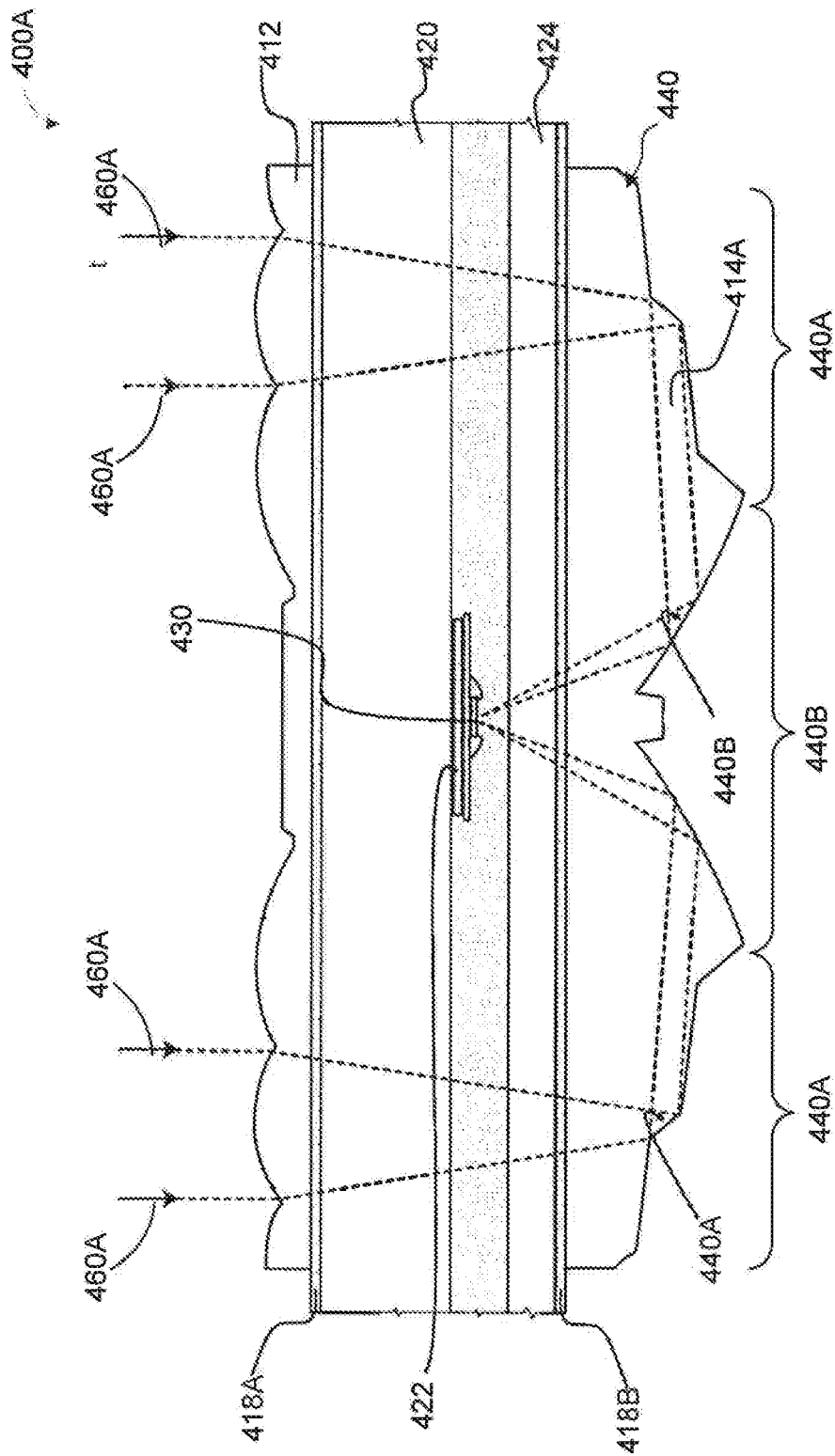
FIGS. 5A to 5O are cross-sectional views of various different light panels operating as a solar panel in accordance with various different embodiments.

The light panels shown in FIGS. 5A to 5D operate based on a one-to-one correspondence between the lenses at the first optic layer 412 and the reflective surface 440 of the second optic layer 414. For example, as shown in FIG. 5A, each of the illustrated light paths 460A travels through the first optic layer 412 to a specific portion of the reflective surface 440.

FIG. 5A is a light panel 400A in which a reflective surface 440 includes a primary reflective area 440A and a secondary reflective area 440B. For the light panel 400A, the primary reflective area 440A receives light directly from the first optic layer 412 and the secondary reflective area 440B receives light from the primary reflective areas 440A. In applications in which the light panel 400A operates as an illumination device, the primary reflective area 440A directs light to the first optic layer 412 while the secondary reflective area 440B directs light received from the light device 430 to the primary reflective area 440A.

Figure 5B:
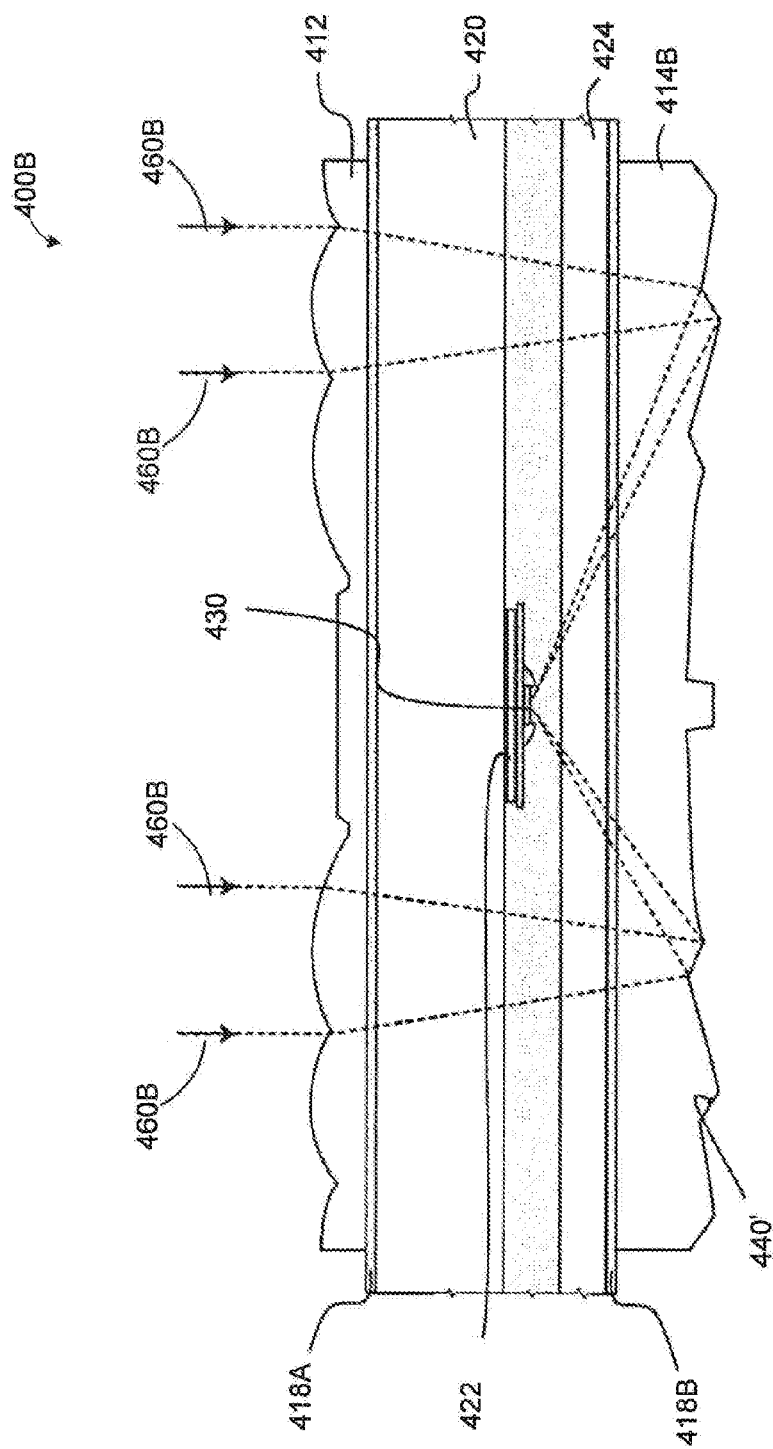

FIG. 5B is a light panel 400B in which the reflective surface 440' of the second optic layer 414B is formed using mirror reflectors. As shown in FIG. 5B, each of the illustrated light paths 460B travels through the first optic layer 412 to a specific portion of the reflective surface 440'.

Figure 5C:
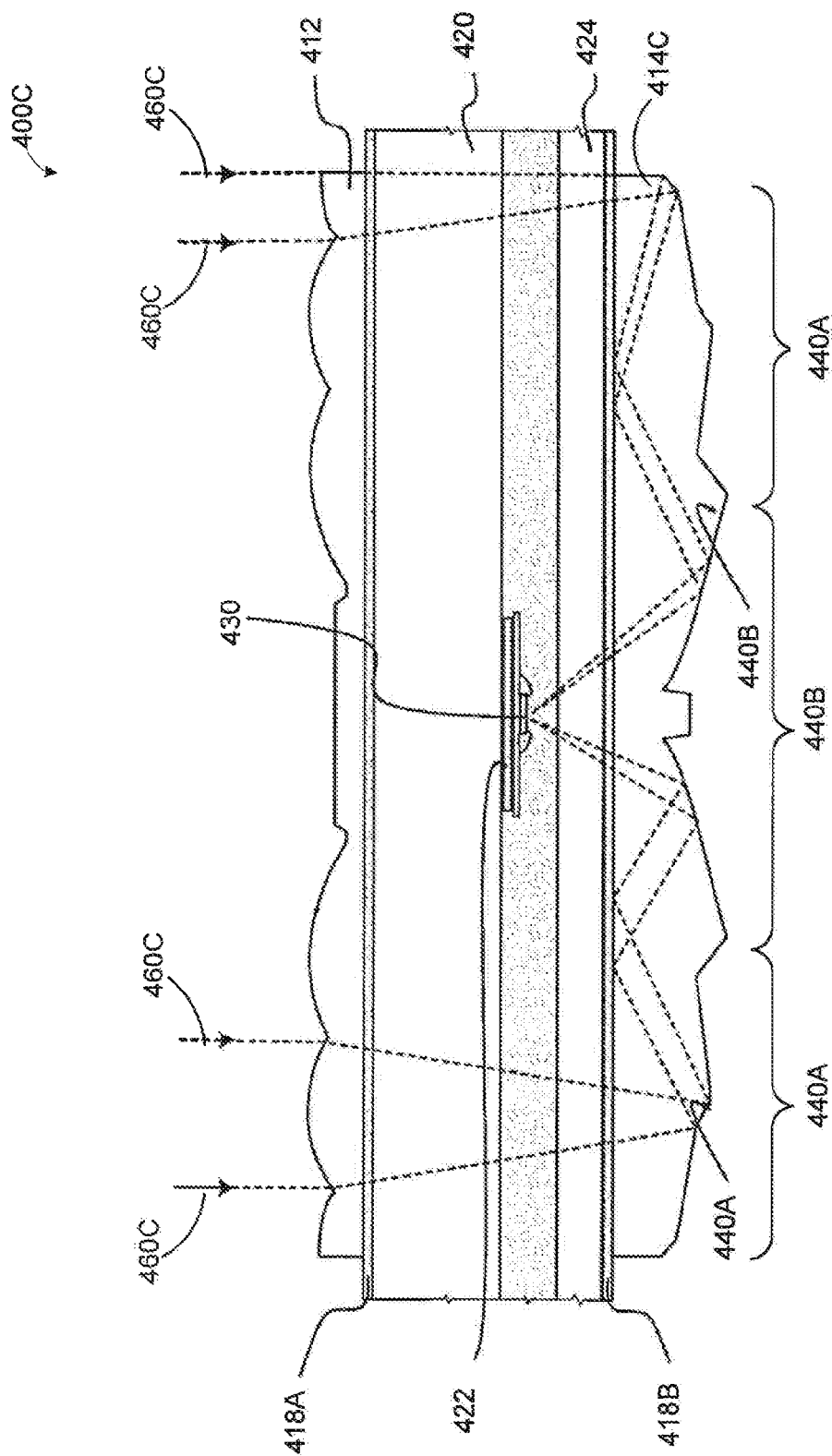

FIG. 5C is a light panel 400C that is similar to the light panel 400A. The light panel 500C includes, at the second optic layer 414C, a reflective surface 440 that also includes a primary reflective area 440A and a secondary reflective area 440B. Unlike the primary reflective area 440A of FIG. 5A, the primary reflective area 440A of the light panel 400C directs light received from the first optic layer 412 to the secondary reflective area 440B with at least one reflection (shown with example light paths 460C) via the second elastomeric interface 418B instead of directly to the secondary reflective area 440B.

Figure 5D:
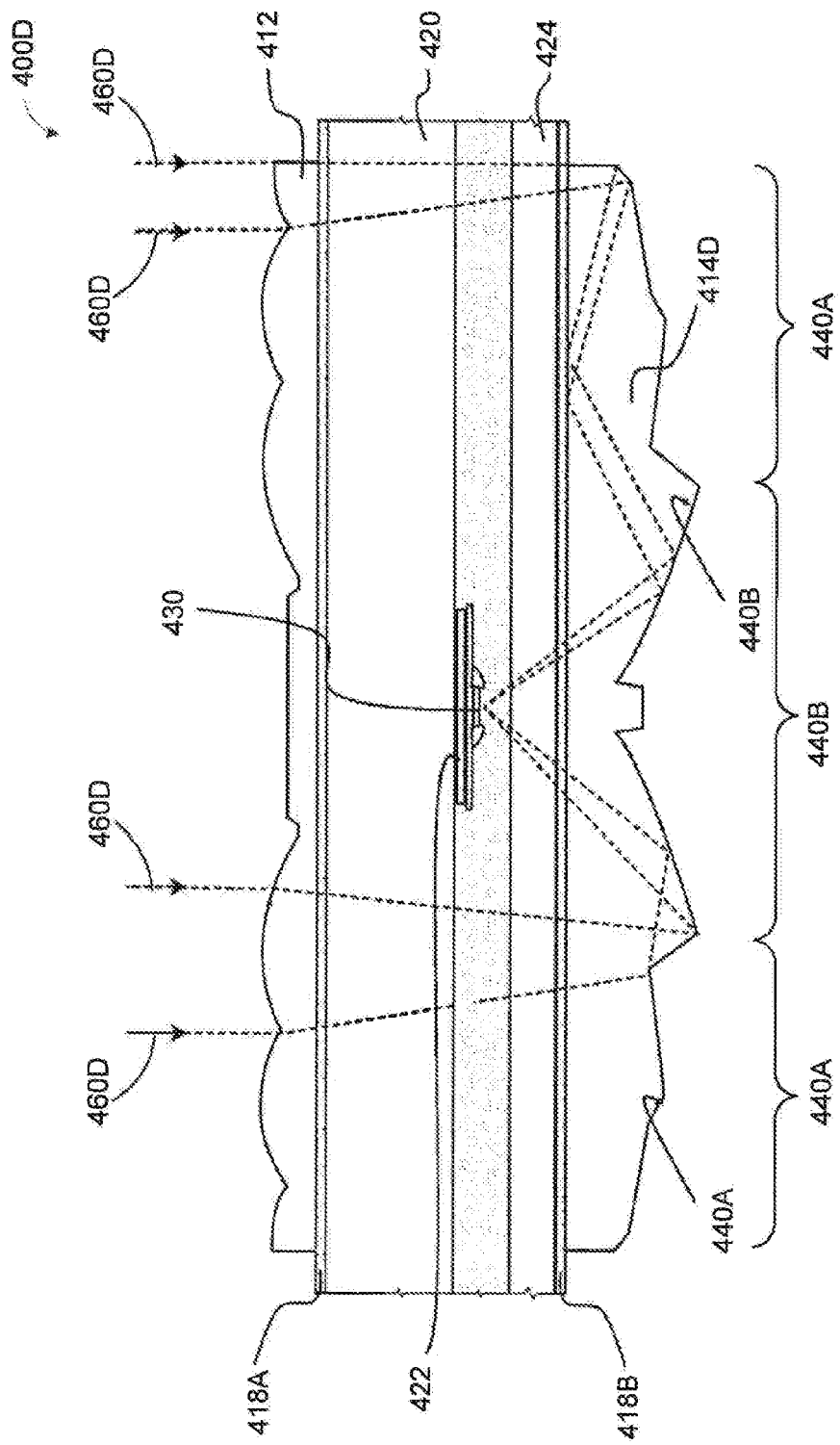

FIG. 5D is a light panel 400D that includes a reflective surface 440 at the second optic layer 414D that also includes a primary reflective area 440A and a secondary reflective area 440B. In the light panel 400D, the primary reflective area 440A may direct light directly to the secondary reflective area 440B or indirectly via at least one reflection at the second elastomeric interface 418B. Example light paths 460D are shown in FIG. 50.

It will be understood that the reflective surface 440 of any one of the light panels 400A, 400C and 400D may be provided as a mirror reflector or operate to reflect light by total internal reflection.

Various methods of assembling the light panel 10 are described herein. In some embodiments, the various components of the light panel 10 may be assembly by being mechanically fitted together, such as by interference fitting. Alternative methods of assembly are described with reference to FIG. 5.

Figure 6:
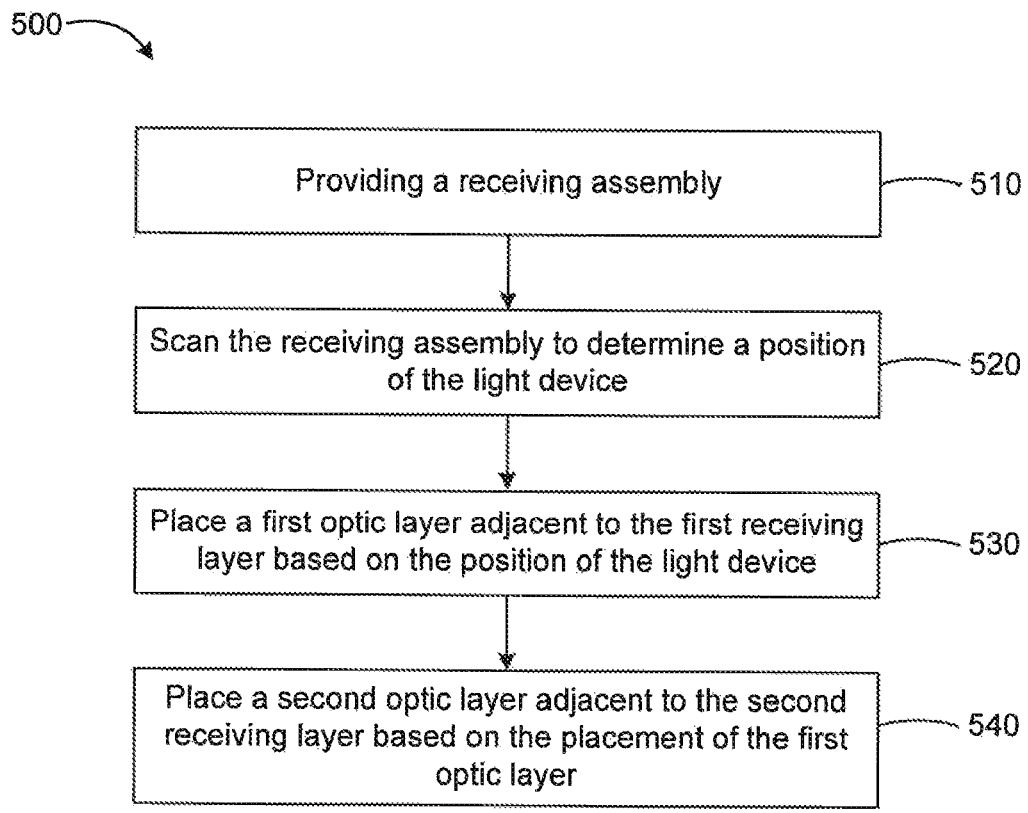
FIG. 6 is a flowchart of an example embodiment of various methods of providing a light panel.

Referring now to FIG. 6, an example method 500 for providing the light panel 10 by an assembler is shown in a flowchart. To illustrate the method 500, reference will be made simultaneously to FIGS. 1A to 1C. The assembler can generally include any one or more hardware and/or software modules that, together, can be used to construct, at least, the light panel 10. It will be understood that the assembler may be used to construct different products. The assembler may be provided as a single unit or multiple different units that can functionally cooperate together to construct the light panel 10.

At 510, the Assembler Provides the Receiving Assembly 16.

As described, the receiving assembly 16 includes the first receiving layer 20 and the second receiving layer 24. The light device 30 can be coupled to the first receiving layer 20. In some embodiments, a heat spreader 122 may be disposed between the first receiving layer 20 and the second receiving layer 24, such as the example embodiment shown in FIG. 2.

When constructing the light panel 10, the assembler can receive a prefabricated receiving assembly 16. The light device 30 is already mounted within the receiving assembly 16 and therefore, the position of the light device 30 is static.

At 520, the Assembler Scans, with an Optical Module, the Receiving Assembly 16 to Determine a Position of the Light Device 30.

In order to determine the position of the light device 30, the optical module of the assembler can systematically scan a surface of the receiving assembly 16, such as a surface of the first receiving layer 20. Since the receiving assembly 16 is substantially transparent, the light device 30 can be visible from the surface of the first receiving layer 20 (see FIG. 1B for example). Accordingly, the optical module may include any conventional device that can capture image data, such as a camera. The captured image data may be provided to a processor module for review in order to determine the position of the light device 30 with respect to the receiving assembly 16. The processor module may be provided as part of the optical module.

In comparison with simply mechanically fitting the components of the light device 30 together, the optical module can minimize inaccurate positioning of the various components. As described herein, the light device 30 can be inaccurately positioned within the receiving assembly 16 at the time of manufacture. In order to facilitate potential inaccurate positioning of the light device 30 when the light panel is mechanically fitted together, the size of the light device 30 may need to be increased to provide a larger surface area for capturing or providing light. On the other hand, the use of the optical module to identify the position of the light device 30 when assembling the light panel 10 can compensate for the inaccurate positioning of the light device 30 within the receiving assembly 16.

The position of the light device 30 may be provided relative to one or more edges of a surface of the receiving assembly 16. For example, the position of the light device 30 may be provided in terms of the Cartesian coordinate system and with respect to two perpendicular edges of the surface of the first receiving layer 20. It will be understood that other coordinate systems and surfaces may similarly be used for representing the position of the light device 30.

The assembler may also store the position of the light device 30 into a storage module, which can include RAM, ROM, one or more hard drives, one or more flash drives or some other suitable data storage elements such as disk drives, etc. located at the assembler or remotely from the assembler. The assembler may also store the captured image data in the storage module.

At 530, the Assembler Places the First Optic Layer 12 Adjacent to the First Receiving Layer 20 Based on the Position of the Light Device 30.

By individually placing the first optic layer 12 onto the receiving assembly 16 based on the position of the light device 30, the tolerance of the light panel 10, and in particular for a light panel array such as array 100, can be improved. In certain existing solar power systems, both optical components and PV cells are prefabricated into arrays. As a result, the positions of each of the optical components and PV cells in the arrays are preset and cannot be altered when they are assembled together into a solar panel array. That is, if any one of the optical components and PV cells in the array were positioned incorrectly or if any one of the optical components experiences shrinkage over time, most, and potentially all, of the optical components and respective PV cells may be misaligned and operation of the solar power system overall would be impaired.

In the described method of providing the light panel 10, the assembler can construct the light panel 10 by aligning individual optic components, such as first optic layer 12 and second optic layer 14, with the respective light device 30.

Once the assembler has determined the position of the light device 30, the assembler can place the first optic layer 12 adjacent to the first receiving layer 20. The assembler can include any known control components that can accurately maneuver and position the first optic layer 12, such as a picker or a mechanical arm.

The assembler may also mount the first optic layer 12 to the first receiving layer 20 with an adhesive material. In general, the adhesive material should also be substantially transparent. As described, the adhesive material may form the elastomeric interface 318, in some embodiments, to facilitate any thermo-expansion at the first optic layer 12.

In some embodiments, the assembler may further place the first optic layer 12 with respect to the light device 30 in order to align each lens at the first optic layer 12 with the light device 30 to facilitate the light path between the one or more lenses and the light device 30.

At 540, the Assembler Places the Second Optic Layer 14 Adjacent to the Second Receiving Layer 24 Based on the Placement of the First Optic Layer 12.

After placing the first optic layer 12 adjacent to the first receiving layer 20, the assembler may proceed to place the second optic layer 14 adjacent to the second receiving layer 24. In some embodiments, the assembler may flip the receiving assembly 16 prior to placing the second optic layer 14 adjacent to the second receiving layer 24.

In embodiments of light panel arrays, such as light panel array 100, the assembler may proceed to place each of the first optic layers 12 to form the first optic layer 112 for the light panel array 100 prior to placing the second optic layers 14 onto the receiving assembly 116.

Continuing with 540, the assembler may determine the placement of the first optic layer 12 with respect to the receiving assembly 16 by scanning, with the optical module, an initial light panel that is composed of the first optic layer 12 and the receiving assembly 16. Since the first optic layer 12 and the receiving assembly 16 are substantially transparent, the assembler can determine, with relatively high accuracy, a position of the first optic layer 12 based on, at least, a portion of a perimeter of the first optic layer 12 as seen from the bottom view of the light panel 10, or the first optic layer 12 may include fiducial markers that the optical module can detect in order to determine the orientation and/or position of the first optic layer 12.

Placing the second optic layer 14 relative to the first optic layer 12 further increases the tolerance and efficiency of the light panel 10 as a whole since the operation of solar panels and illumination devices rely substantially on the alignment of the light device 30 and the optical components, such as the first optic layer 12 and the second optic layer 14.

The assembler may then proceed to mount the second optic layer 14 to the second receiving layer 24 based on the placement of the respective first optic layer 12. The assembler may mount the second optic layer 14 using an adhesive material that is substantially transparent. It will also be understood that 530 and 540 may be performed in reversed order. That is, the assembler may place the second optic layer 14 with respect to the light device 30, and then place the first optic layer 12 with respect to the second optic layer 14.

In some embodiments, the various components of the light panel array 100 shown in FIG. 2 may include fiducial markers that can be detected by the optical module in order to identify a position and/or orientation of those components so that those components may be aligned with respect to one another. Providing fiducial markers on components in addition to the first optic layer 12 may help to increase the efficiency in the assembly of the light panel array 100.

The receiver assembly 116 of FIG. 2 may also be assembled with the use of the optical module.

The present invention has been described here by way of example only. Various modification and variations may be made to these example embodiments without departing from the spirit and scope of the invention, which is limited only by the appended claims.

We claim:

1. A light panel comprising:
    a first optic layer for transmitting light;
    a second optic layer having a reflective surface configured for one of directing light from the first optic layer and directing light to the first optic layer; and
    a receiving assembly disposed between the first optic layer and the second optic layer, the receiving assembly having:
        a first receiving layer adjacent to the first optic layer;
        a second receiving layer adjacent to the second optic layer and separated from the first receiving layer; and
        a light device coupled to the first receiving layer, the light device being operable to receive light from the reflective surface via the second receiving layer when the reflective surface is configured to direct light from the first optic layer; and the light device being operable to provide light to the reflective surface via the second receiving layer when the reflective surface is configured to direct light to the first optic layer;
    wherein each of the first optic layer, the second optic layer and the receiving assembly is substantially transparent.

2. The light panel of claim 1, wherein the second optic layer is substantially parallel to the first optic layer.

3. The light panel of any one of claims 1 and 2, wherein the receiving assembly is substantially rigid.

4. The light panel of claim 1, wherein the light device is coupled to the first receiving layer such that an opening of the light device faces the reflective surface of the second optic layer and faces away from the first optic layer.

5. The light panel of claim 1, wherein the reflective surface directs light from one of the first optic layer and the light device to the other one of the first optic layer and the light device by reflecting the light.

6. The light panel of claim 5, wherein the reflective surface directs light from one of the first optic layer and the light device to the other one of the first optic layer and the light device within two reflections.

7. The light panel of claim 1, wherein:
the reflective surface comprises a primary reflective area and a secondary reflective area; and
one of the primary reflective area and the secondary reflective area directs light to the other one of the primary reflective area and the secondary reflective.

8. The light panel of claim 1, wherein the light device comprises a photovoltaic cell for collecting the light transmitted from the first optic layer and reflected from the reflective surface of the second optic layer.

9. The light panel of claim 8, wherein:
the first optic layer receives the light from an external light source and transmits the light to the second optic layer; and
the reflective surface of the second optic layer directs the light from the first optic layer to the light device using one or more reflections.

10. The light panel of claim 1, wherein the light device comprises a light source for providing the light to be transmitted, by the first optic layer, externally away from the light panel.

11. The light panel of claim 10, wherein:
the reflective surface of the second optic layer receives the light from the light source and directs the light to the first optic layer using one or more reflections; and
the first optic layer transmits the reflected light from the second optic layer externally away from the light panel.

12. The light panel of claim 1, wherein:
one of the first optic layer and the second optic layer comprises a first material associated with a first coefficient of thermal expansion; and
one of the first receiving layer and the second receiving layer comprises a second material associated with a second coefficient of thermal expansion, wherein the first coefficient of thermal expansion and the second coefficient of thermal expansion are different.

13. The light panel of claim 12, wherein the first coefficient of thermal expansion is greater than the second coefficient of thermal expansion.

14. The light panel of claim 12, wherein the first material comprises a polymer-based material and the second material comprises glass.

15. The light panel of claim 14, wherein the polymer-based material comprises poly(methyl methacrylate) (PMMA).

16. The light panel of claim 1, further comprising an elastomeric interface disposed between the first optic layer and the first receiving layer, wherein the elastomeric interface physically adjusts with at least physical changes at the first optic layer.

17. The light panel of claim 16, wherein the elastomeric interface comprises at least one of silicone, ethylene-vinyl acetate and ionomer.

18. The light panel of claim 1, wherein the first optic layer comprises an annular lens.

19. The light panel of claim 18, wherein the light device is coupled to the first receiving layer relative to the annular lens to facilitate a light path between the annular lens and the light device via the reflective surface.

20. The light panel of claim 18, wherein:
the first optic layer further comprises an outer annular lens concentric with the annular lens, wherein an inner edge of the outer annular lens is coupled to an exterior edge of the annular lens; and
the light device is mounted to the first receiving layer relative to the annular lens and the outer annular lens to facilitate a light path between the first optic layer and the light device via the reflective surface.

21. The light panel of claim 1, wherein the receiving assembly further includes a heat spreader disposed between the first receiving layer and the second receiving layer.

22. The light panel of claim 21, wherein the light device is mounted to a portion of the heat spreader.

23. The light panel of claim 21, wherein the heat spreader is provided in a configuration that minimally interferes with transmission of light between the first optic layer and the second optic layer.

24. The light panel of claim 21, wherein the heat spreader is provided in a hub and spoke configuration.

25. The light panel of claim 21, wherein the heat spreader is provided in a planar configuration.

26. The light panel of claim 1, wherein the first receiving layer and the second receiving layer are separated by an encapsulant.

27. The light panel of claim 26, wherein the encapsulant comprises silicone.

28. A light panel array comprising a series of at least two light panels defined in accordance with claim 1.

29. A method of providing a light panel by an assembler comprising:
providing a receiving assembly, the receiving assembly having:
a first receiving layer;
a second receiving layer separated from the first receiving layer; and
a light device coupled to the first receiving layer;
scanning, with an optical module, the receiving assembly to determine a position of the light device;
placing a first optic layer adjacent to the first receiving layer based on the position of the light device; and
placing a second optic layer adjacent to the second receiving layer based on the placement of the first optic layer;
wherein each of the first optic layer, the second optic layer and the receiving assembly is substantially transparent.

30. The method of providing the light panel of claim 29, wherein scanning the receiving assembly further comprises storing the position of the light device.

31. The method of providing the light panel of any one of claims 29 and 30, wherein:
the first optic layer comprises at least one lens; and
placing the first optic layer adjacent to the first receiving layer further comprises aligning each lens with the light device to facilitate a light path between the lens and the light device.

32. The method of providing the light panel of claim 29, wherein placing the first optic layer adjacent to the first receiving layer further comprises mounting the first optic layer to the first receiving layer using an adhesive material.

33. The method of providing the light panel of claim 32, wherein the adhesive material forms an elastomeric interface that physically adjusts with at least physical changes at the first optic layer.

34. The method of providing the light panel of claim 29 further comprising:
  flipping the receiving assembly prior to placing the second optic layer adjacent to the second receiving layer.

35. The method of providing the light panel of claim 29, wherein placing the second optic layer adjacent to the second receiving layer further comprises:
  after placing the first optic layer adjacent to the first receiving layer, scanning, with the optical module, an initial light panel composed of the first optic layer and the receiving assembly to determine a position of the first optic layer relative to the receiving assembly.

36. The method of providing the light panel of claim 29, wherein placing the second optic layer adjacent to the second receiving layer further comprises mounting the second optic layer to the second receiving layer using an adhesive material.

\* \* \* \* \*